(12) United States Patent
Ohtake

(10) Patent No.: US 7,372,309 B2
(45) Date of Patent: May 13, 2008

(54) RESET CIRCUIT

(75) Inventor: Hisao Ohtake, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/229,785

(22) Filed: Sep. 20, 2005

(65) Prior Publication Data

US 2006/0091923 A1      May 4, 2006

(30) Foreign Application Priority Data

Oct. 28, 2004      (JP)      ............................. 2004-314279

(51) Int. Cl.
*H03L 7/00* (2006.01)
(52) U.S. Cl. ...................... 327/142; 327/143
(58) Field of Classification Search ......... 327/142–143
See application file for complete search history.

(56) References Cited

U.S. PATENT DOCUMENTS

| | | | | |
|---|---|---|---|---|
| 5,027,006 A | * | 6/1991 | Queinnec et al. | 327/143 |
| 5,517,144 A | * | 5/1996 | Nakashima | 327/198 |
| 5,629,642 A | * | 5/1997 | Yoshimura | 327/142 |
| 5,936,443 A | * | 8/1999 | Yasuda et al. | 327/143 |
| 6,346,835 B1 | * | 2/2002 | Ozeki et al. | 327/143 |
| 6,492,848 B1 | * | 12/2002 | Lee | 327/143 |
| 6,683,481 B1 | * | 1/2004 | Zhou et al. | 327/143 |
| 6,686,782 B2 | * | 2/2004 | Kinoshita et al. | 327/143 |

FOREIGN PATENT DOCUMENTS

JP      2002-228690      8/2002

\* cited by examiner

*Primary Examiner*—Dinh T. Le
(74) *Attorney, Agent, or Firm*—Nixon Peabody LLP; Marc W. Butler

(57) ABSTRACT

A circuit includes a reset circuit body and a delay circuit. The circuit body outputs a signal which indicates a reset when the supply of a supply voltage is initiated until the supply voltage reaches a sufficient value and indicates release of the reset after it reaches the sufficient value. The delay circuit outputs a signal obtained by delaying start of the indication of the release of the reset, taking into consideration of a sharp rise of the supply voltage. The reset circuit may include a circuit for eliminating a momentary change indicating the reset, and a selection circuit for selecting either an output of the delay circuit or an output of the momentary reset indication elimination circuit.

7 Claims, 10 Drawing Sheets

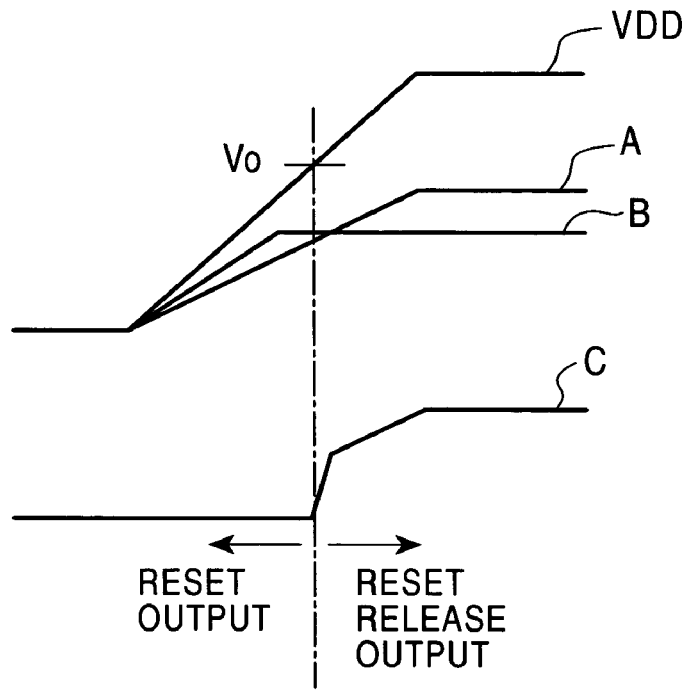
FIG. 3A
FIG. 3B
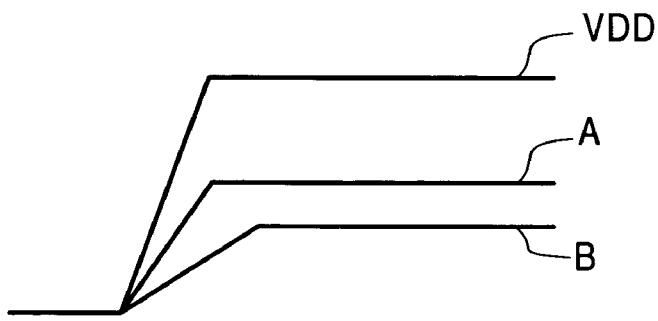
FIG. 4A
FIG. 4B

RESET CIRCUIT

BACKGROUND OF THE INVENTION

1. Field of the Invention

The present invention relates to a reset circuit for generating a reset signal which is provided to an electronic circuit or the like when power supply is initiated.

2. Description of the Related Art

A conventional reset circuit is described, for example, in Japanese Patent Publication Kokai No. 2002-228690. The conventional reset circuit will now be described with reference to FIG. 2.

Referring to FIG. 2, the conventional reset circuit includes a voltage division circuit 10, a reference voltage circuit 6, a comparator circuit 5, and an output terminal 8. The voltage division circuit 10 linearly divides a power supply voltage VDD through two resistors 2 and 3, which are connected in series between a power supply terminal 1 and a ground terminal 4, and outputs a signal having a voltage A at the division point. The reference voltage circuit 6 outputs a signal having a reference voltage B. The comparator circuit 5 compares the output voltage A from the voltage division circuit 10 with the reference voltage B from the reference voltage circuit 6.

Since the output voltage A from the voltage division circuit 10 is obtained through a resistance-based division of the power supply voltage VDD, the output voltage A changes in proportion to the power supply voltage VDD when power supply is initiated to supply voltage a voltage as shown in FIG. 3a. On the other hand, when power supply is initiated, the reference voltage B from the reference voltage circuit 6 is constant, regardless of the change in the power supply voltage VDD, after the power supply voltage VDD exceeds a specific value. Typically, when the output voltage (i.e., the divided voltage) A is lower than or equal to the reference voltage B based on the comparison by the comparator circuit 5, it is determined that the power supply voltage VDD is lower than or equal to a predetermined voltage $V_0$, so that a reset signal at a low level "L" is output through the output terminal 8 as shown in FIG. 3b. When the output voltage A is higher than the reference voltage B, it is determined that the power supply voltage VDD is higher than the predetermined voltage $V_0$, so that a reset release signal at a high level "H" is output through the output terminal 8 as shown in FIG. 3b.

Thus, when power supply is initiated to supply a voltage, the waveform of the output voltage A and the waveform of the reference voltage B cross each other at a position where the power supply voltage is equal to the predetermined voltage $V_0$ so as to form an intersection at the crossing point, so that the logic level of an output C from the reset circuit is switched when crossing the intersection.

Although the reference voltage circuit 6 is typically designed to output a reference voltage signal B simultaneously with the rise of the power supply voltage, it requires a certain time from the start of power supply to output a stable, constant reference voltage signal B. The required time is determined by the circuit configuration of the reference voltage circuit 6, which typically employs a capacitor having a large time constant.

Accordingly, if the power supply voltage VDD rises sharply, the output voltage A from the voltage division circuit 10 jumps over the reference voltage B without crossing the reference voltage B, thus forming no intersection between the waveform of the output voltage A and the waveform of the reference voltage B as shown in FIG. 4a.

Thus, the conventional reset circuit has a problem in that the output C from the comparator circuit 5 (=output voltage A−reference voltage B) is positive from the start of power supply, thereby failing to output a reset signal through the output terminal 8.

The above Japanese Patent Publication has suggested a method for solving the problem. However, in some cases, such a problem cannot be solved through the circuit configuration of the reference voltage circuit 6 or conditions regarding the rise of the power supply voltage.

In addition, if the power supply voltage VDD, which has been stabilized after exceeding the predetermined voltage $V_0$, momentarily falls below the predetermined voltage $V_0$ due to noise or the like, the reset circuit may output a reset signal to erroneously reset the electronic circuit.

SUMMARY OF THE INVENTION

Therefore, the present invention has been made in view of the above problems, and it is an object of the present invention to provide a reset circuit, which ensures that a reset signal is output when the supply of a power supply voltage is initiated, or a reset circuit which prevents erroneous reset due to noise after the power supply voltage is stabilized.

In accordance with one aspect of the present invention, the above and other objects can be accomplished by the provision of a reset circuit comprising a reset circuit body for outputting a signal indicating a reset when supply of a power supply voltage is initiated until the power supply voltage reaches a sufficient value and indicating release of the reset after the power supply voltage reaches the sufficient value; and a delay circuit, provided subsequent to the reset circuit body, for outputting a signal obtained by delaying start of the indication of the release of the reset in the output signal of the reset circuit body by a time given under an assumption that the power supply voltage rises sharply when the supply of the power supply voltage is initiated.

In accordance with another aspect of the present invention, there is provided a reset circuit comprising a reset circuit body for outputting a signal indicating a reset when supply of a power supply voltage is initiated until the power supply voltage reaches a sufficient value and indicating release of the reset after the power supply voltage reaches the sufficient value; and a momentary reset indication elimination circuit, provided subsequent to the reset circuit body, for eliminating a momentary change indicating the reset in the output signal of the reset circuit body when the momentary change occurs in the output signal after the power supply voltage rises.

In accordance with yet another aspect of the present invention, there is provided a reset circuit comprising a reset circuit body for outputting a signal indicating a reset when supply of a power supply voltage is initiated until the power supply voltage reaches a sufficient value and indicating release of the reset after the power supply voltage reaches the sufficient value; a delay circuit, provided subsequent to the reset circuit body, for outputting a signal obtained by delaying start of the indication of the release of the reset in the output signal of the reset circuit body by a time given under an assumption that the power supply voltage rises sharply when the supply of the power supply voltage is initiated; a momentary reset indication elimination circuit, provided subsequent to the reset circuit body, for eliminating a momentary change indicating the reset in the output signal of the reset circuit body when the momentary change occurs in the output signal after the power supply voltage rises; and a selection circuit for selecting, as an output from the reset circuit, an output signal of the delay circuit when the supply of the power supply voltage is initiated and an output signal of the momentary reset indication elimination circuit after the power supply voltage rises.

In accordance with the first and third aspects of the present invention, it is possible to provide a reset circuit which ensures that a reset signal is output when the supply of the power supply voltage is initiated.

In accordance with the second and third aspects of the present invention, it is possible to provide a reset circuit which prevents erroneous reset due to noise after the power supply voltage is stabilized.

BRIEF DESCRIPTION OF THE DRAWINGS

The above and other objects, features and other advantages of the present invention will be more clearly understood from the following detailed description taken in conjunction with the accompanying drawings, in which:

FIGS. 3a and 3b are timing charts of each node of the reset circuit of FIG. 2;

FIGS. 4a and 4b are timing charts of each node of the reset circuit of FIG. 2;

DESCRIPTION OF THE PREFERRED EMBODIMENTS (A) First Embodiment

A reset circuit according to a first embodiment of the present invention will now be described in detail with reference to the drawings.

(A-1) Configuration of First Embodiment

Figure 1:
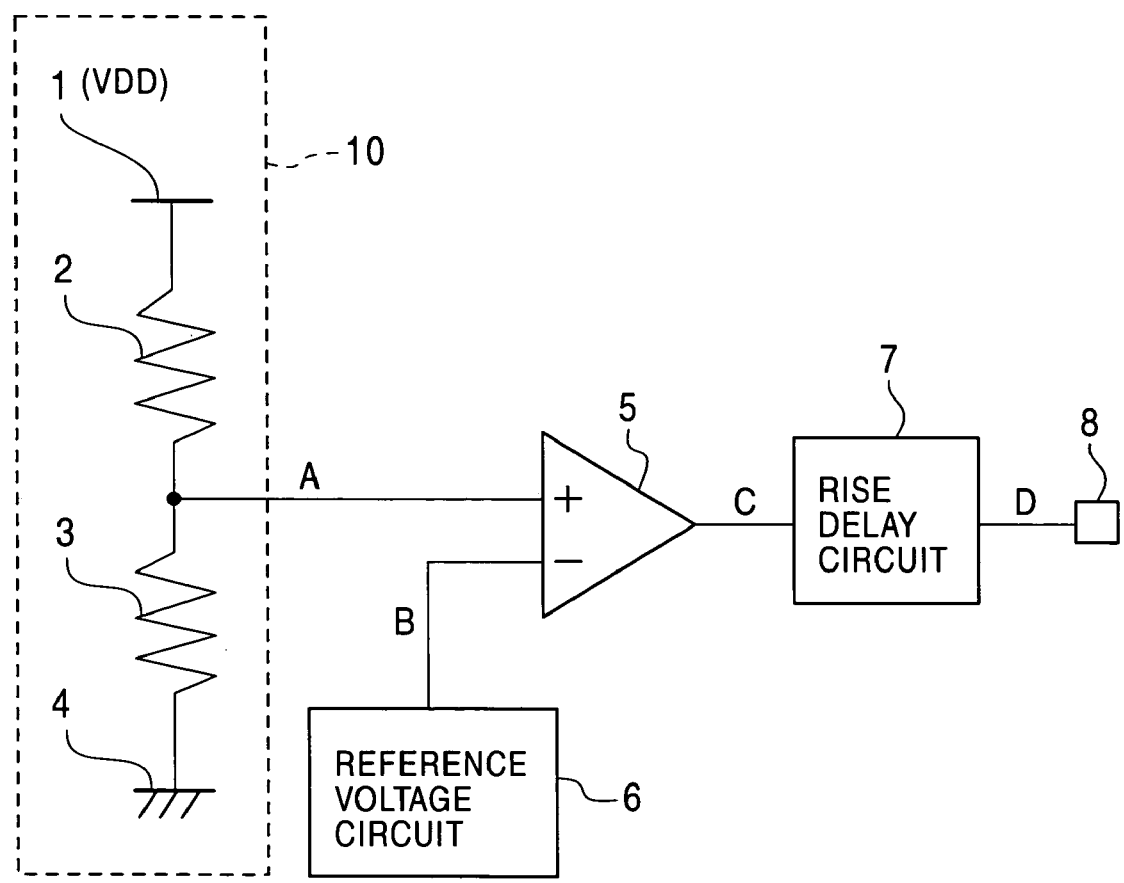
FIG. 1 is a block diagram illustrating a reset circuit according to a first embodiment of the present invention.
Figure 2:
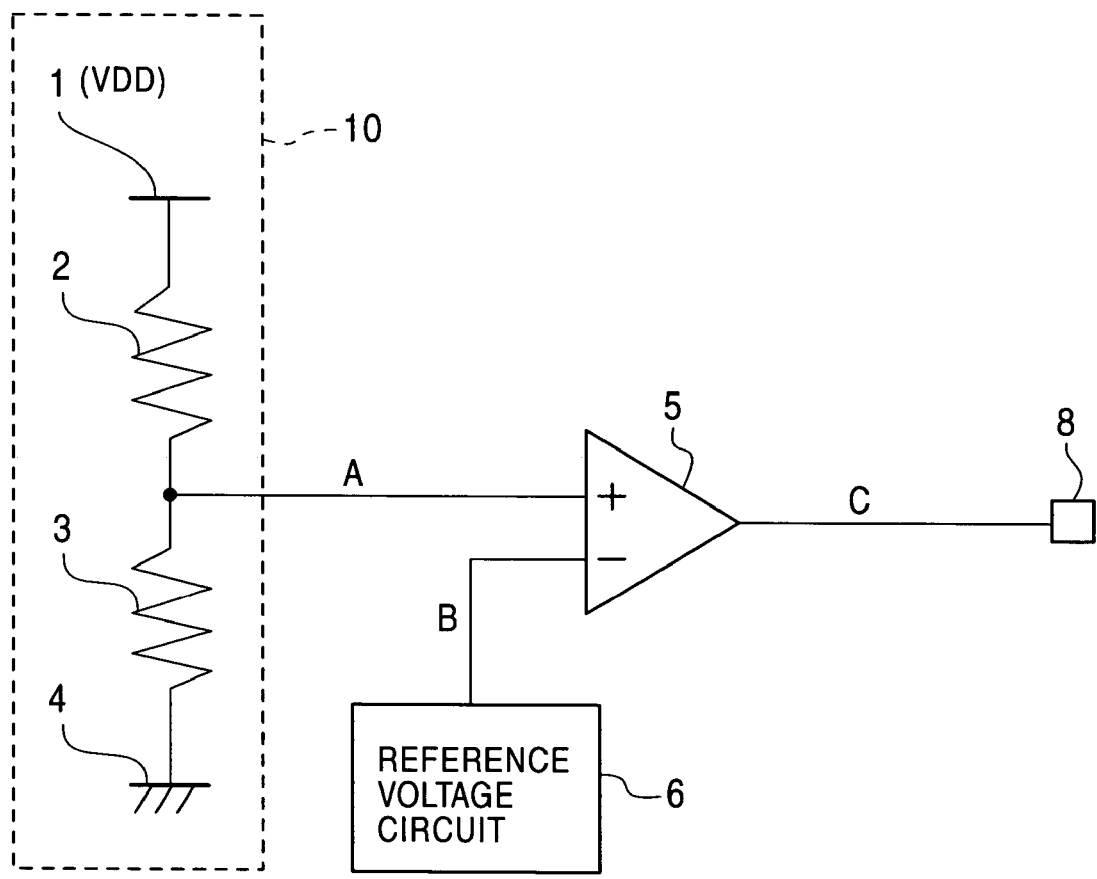
FIG. 2 is a block diagram illustrating a conventional reset circuit.

FIG. 1 is a block diagram illustrating a reset circuit according to the first embodiment, where elements identical or corresponding to those of the conventional reset circuit shown in FIG. 2 are denoted by the same reference numerals.

In FIG. 1, the reset circuit according to the first embodiment comprises a reset circuit body including a voltage division circuit 10, a reference voltage circuit 6, and a comparator circuit 5, which are similar to those of the conventional reset circuit, and further comprises a rise delay circuit 7. The rise delay circuit 7 outputs a signal D, which is obtained by delaying the rise of an output signal C of the comparator circuit 5, to an output terminal 8.

Figure 5:
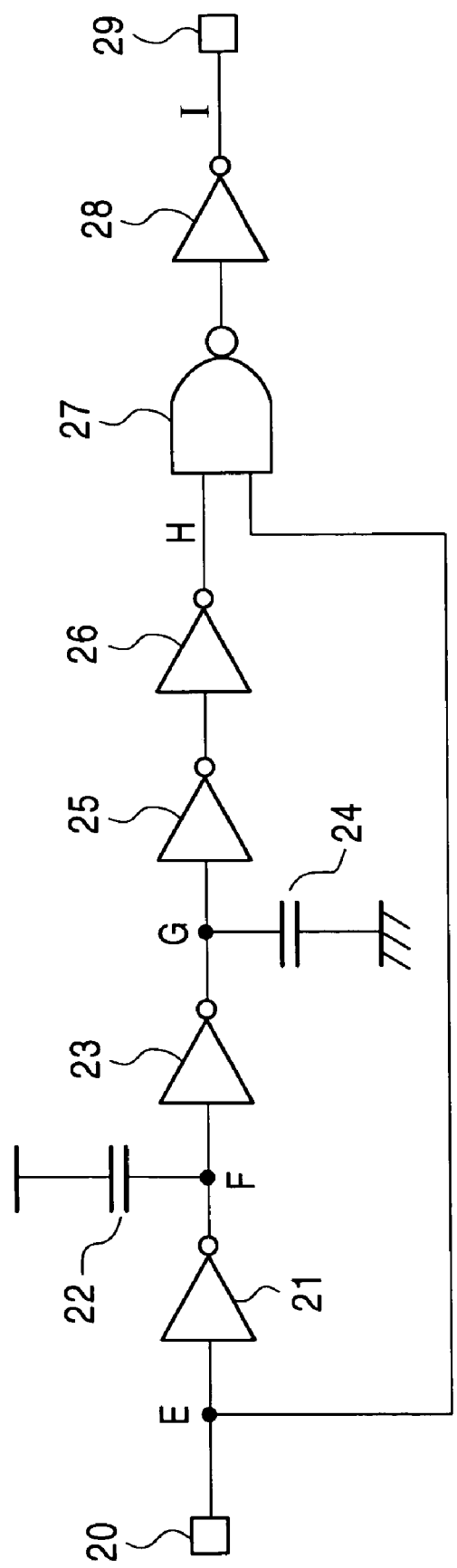
FIG. 5 is a block diagram illustrating a rise delay circuit according to the first embodiment.

An example configuration of the rise delay circuit 7 is shown in FIG. 5. In FIG. 5, the rise delay circuit 7 comprises five inverters 21, 23, 25, 26, and 28, and two capacitors 22 and 24, and a 2-input NAND gate 27.

The four inverters 21, 23, 25, and 26 are connected in a cascade fashion such that the output signal C of the comparator circuit 5 (shown as a signal E in FIG. 5) is input to the first inverter 21 through an input terminal 20 of the rise delay circuit 7. The capacitor 22 is connected between a power supply terminal and a connection point between the inverters 21 and 23. The capacitor 24 is also connected between the ground terminal and a connection point between the inverters 23 and 25. An output H from the inverter 26 and the output signal C of the comparator circuit 5, which is input through the input terminal 20, are input to the 2-input NAND gate 27. An output terminal of the NAND gate 27 is connected to an input terminal of the inverter 28, and an output I from the inverter 28 is provided to an output terminal 29 of the rise delay circuit 7.

(A-2) Operation of First Embodiment

Figure 6:
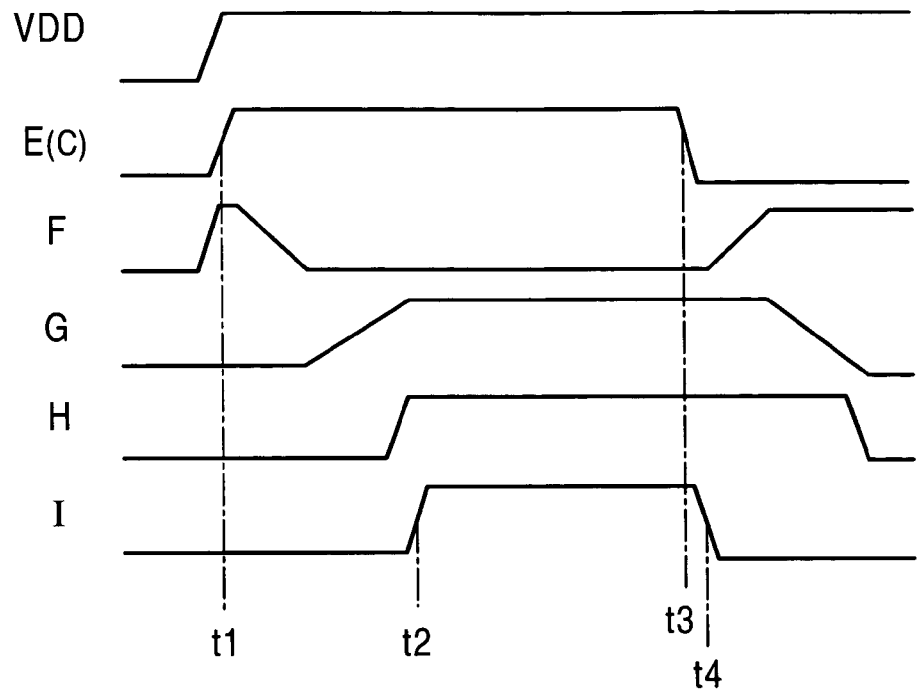
FIG. 6 is a timing chart of each node of the rise delay circuit according to the first embodiment.

The operation of the reset circuit according to the first embodiment will now be described with reference to timing charts of FIGS. 6 and 7.

The voltage division circuit 10, the reference voltage circuit 6, and the comparator circuit 5 in the reset circuit according to the first embodiment operate in the same manner as those of the conventional reset circuit shown in FIG. 2 (see FIGS. 3 and 4).

In the reset circuit according to the first embodiment, the output signal C of the comparator circuit 5 is not directly used as a reset signal, and, instead, the signal D, obtained by delaying the rise of the output signal C through the rise delay circuit 7, is output as a reset signal at the "L" level. Specifically, the rise delay circuit 7 outputs a specific delay interval of the "L" level when the power supply voltage rises, and outputs a signal following the input signal C of the rise delay circuit 7 after the specific delay interval.

Figure 7:
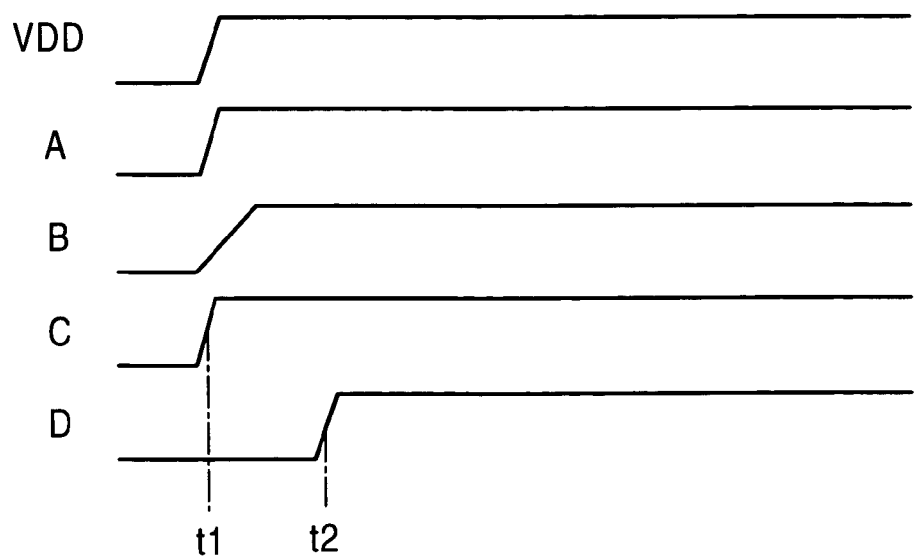
FIG. 7 is a timing chart of each node of the reset circuit according to the first embodiment.

The timing chart of FIG. 7 shows how the signal of each node of the reset circuit of FIG. 1 varies when the power supply voltage VDD rises sharply, which causes the above problem in the conventional reset circuit. Even if the output voltage A of the voltage division circuit 10 rises above the reference voltage B when the power supply voltage VDD rises sharply, the rise delay circuit 7 allows an "L" level signal D (i.e., a reset signal) to be output from the reset circuit during a specific delay interval (t1 to t2 in FIG. 7), after which an "H" level signal D (i.e., a reset release signal) is output from the reset circuit.

Accordingly, it is ensured that the reset signal (the "L" level signal D) is output and also that an electronic circuit of each portion is reset when power supply is initiated.

The rise delay circuit 7 illustrated in FIG. 5 forms the signal D by delaying the rise of the output signal C of the comparator circuit 5 as described below. An early part of the timing chart of FIG. 6 also shows how the signal of each node of the rise delay circuit 7 of FIG. 5 varies when the power supply voltage VDD rises sharply, which causes the above problem in the conventional reset circuit.

Of course, no electrical charge is stored on the capacitor 22 or 24 before the rise of the power supply voltage VDD. Immediately after the power supply voltage VDD starts rising sharply, the voltage of an output point F of the inverter 21 is close to the power supply voltage VDD since the capacitor 22 is not charged, and the output voltage C of the comparator circuit 5 (i.e., the voltage E of the input terminal 20) is close to the ground voltage GND. Accordingly, when the power supply voltage VDD rises sharply, the voltage of the output point F of the inverter 21 also rises, regardless of the inversion operation of the inverter 21.

Thereafter, when the output voltage C of the comparator circuit 5 (i.e., the voltage E of the input terminal 20) reaches almost the "H" level, the capacitors 22 and 24 have been charged to a certain level, and the inverters 21, 23, 25, 26, and 28 and the NAND gate 27 become able to perform their operations normally. Accordingly, each of the inverters 21, 23, 25, 26, and 28 and the NAND gate 27 changes its output voltage after a delay time, which is determined by its element constant, from a change in its input voltage based on the output voltage C (i.e., the voltage E of the input terminal 20) of the comparator circuit 5.

For example, outputs F, G, and H from the inverters 21, 23, and 26 each rise or fall gradually after a certain delay time from the rise of the output voltage C of the comparator circuit 5. For example, the voltage of the output point G of the inverter 23 rises after a certain delay time from the fall of the voltage of the input point F of the inverter 23. After the output voltage C of the comparator circuit 5 (i.e., the voltage E of the input terminal 20) reaches the "H" level, the NAND gate 27 functions as an inverter for inverting the output H from the inverter 26 since the output H from the inverter 26 is input to one input terminal of the NAND gate 27 and the output voltage C is input to the other input terminal thereof. A propagation delay determined by the element constant of the NAND gate 27 also occurs during the inversion operation of the NAND gate 27. As shown in FIG. 6, a propagation delay determined by the element constant of the inverter 28 also occurs while the inverter 28 operates to invert and output its input voltage to the output terminal 29.

A group of the inverters (including the NAND gate), each of which inverts a rising or falling edge and delays its propagation as described above, considerably delay the rise of the output voltage C of the comparator circuit 5 and output the delayed signal as an output I of the last inverter 28 (i.e., the output D of the rise delay circuit 7). A specific delay interval can be predetermined by selecting the number of inverters.

Although the output voltage C of the comparator circuit 5 (i.e., the voltage E of the input terminal 20) is stabilized after reaching the "H" level, it is now assumed that the output voltage C of the comparator circuit 5 is changed, for example, falls to the "L" level for whatever reason. A later part of the timing chart of FIG. 6 shows how the signal of each node of the rise delay circuit 7 of FIG. 5 varies when the output voltage C of the comparator circuit 5 falls to the "L" level.

The inverters 21, 23, and 26 sequentially follow the change of the output voltage C of the comparator circuit 5 with their delay times determined by their element constants. However, the output voltage of the NAND gate 27 follows the fall of the input voltage E of the input terminal 20 (i.e., the output voltage C of the comparator circuit 5) to the "L" level with a short delay time (t3 to t4 in FIG. 6) determined by the element constant of the NAND gate 27, regardless of the output H from the inverter 26 since the "L" voltage E of the input terminal 20 is input to one of the input terminals of the NAND gate 27.

That is, when the power supply voltage rises, the rise delay circuit 7 outputs a reset signal having a specific delay time of the "L" level, and thereafter outputs a voltage following the input voltage E. However, when the input voltage E falls, the rise delay circuit 7 outputs a voltage following the input voltage E with a very short delay time.

(A-3) Advantage of First Embodiment

The reset circuit according to the first embodiment adds the rise delay circuit 7 between the comparator circuit 5 and the output terminal 8 as described above, thereby providing a reset circuit which outputs a proper reset signal even when the power supply voltage rises sharply.

(B) Second Embodiment

A reset circuit according to a second embodiment of the present invention will now be described in detail with reference to the drawings.

(B-1) Configuration of Second Embodiment

Figure 8:
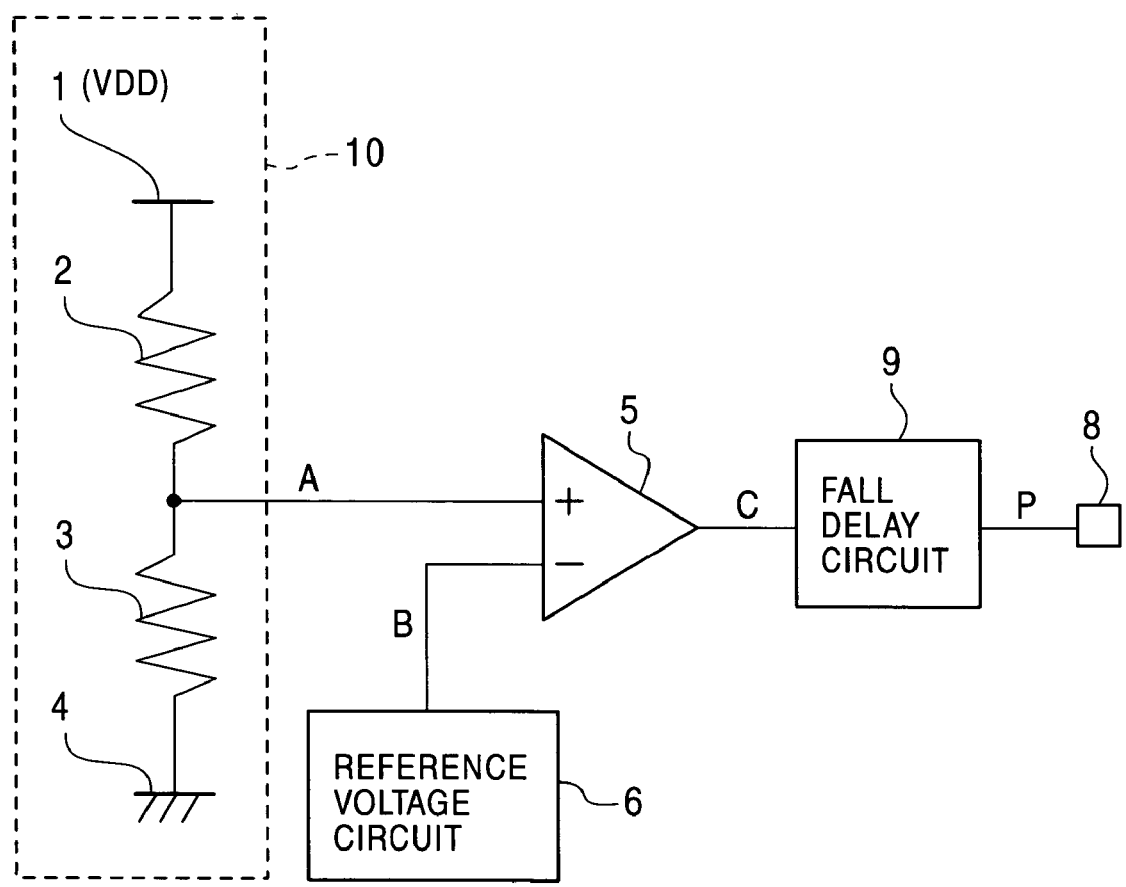
FIG. 8 is a block diagram illustrating a reset circuit according to a second embodiment of the present invention.

FIG. 8 is a block diagram illustrating a reset circuit according to the second embodiment, where elements identical or corresponding to those of the first embodiment shown in FIG. 1 are denoted by the same reference numerals.

In FIG. 8, the reset circuit according to the second embodiment comprises a reset circuit body including a voltage division circuit 10, a reference voltage circuit 6, and a comparator circuit 5, which are similar to those of the conventional reset circuit and the reset circuit according to the first embodiment, and further comprises a fall delay circuit 9. The fall delay circuit 9 outputs a signal P, which is obtained by delaying the fall of an output signal C of the comparator circuit 5, to an output terminal 8.

Figure 9:
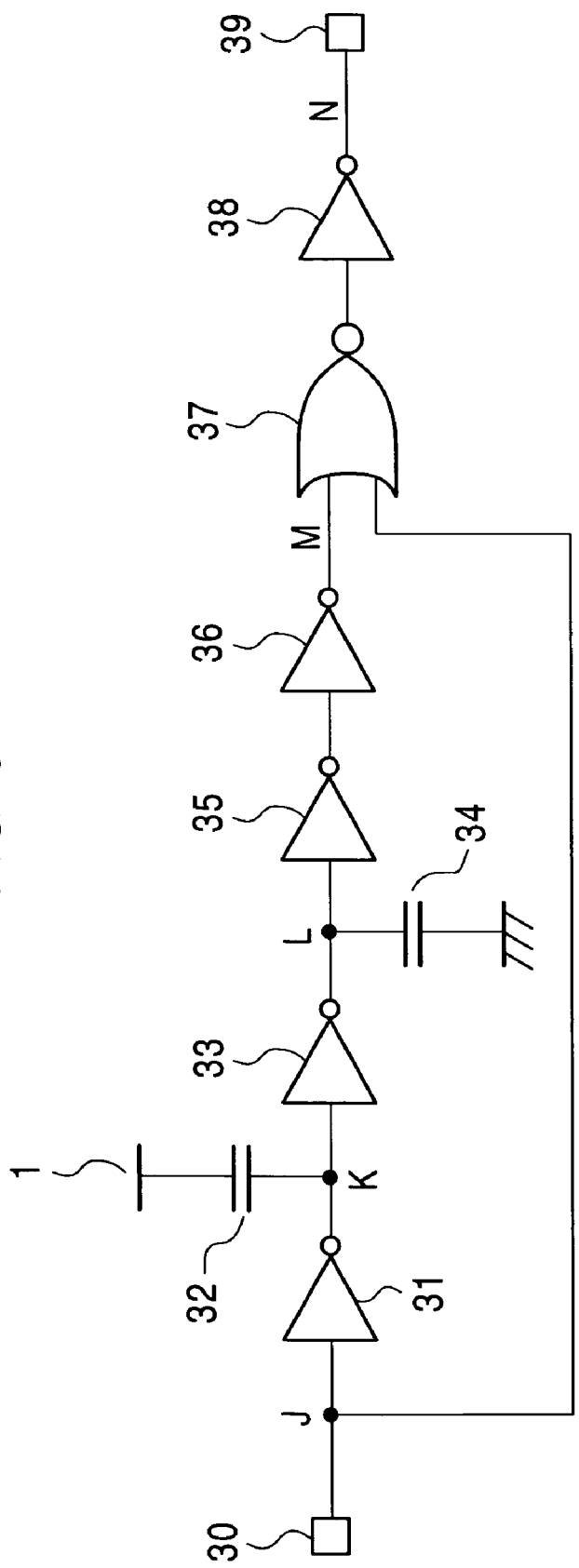
FIG. 9 is a block diagram illustrating a fall delay circuit according to the second embodiment.

An example configuration of the fall delay circuit 9 is shown in FIG. 9. In FIG. 9, the fall delay circuit 9 comprises five inverters 31, 33, 35, 36, and 38, and two capacitors 32 and 34, and a 2-input NOR gate 37.

The four inverters 31, 33, 35, and 36 are connected in a cascade fashion such that the output signal C of the comparator circuit 5 (shown as a signal J in FIG. 9) is input to the first inverter 31 through an input terminal 30 of the fall delay circuit 9. The capacitor 32 is connected between the power supply terminal and a connection point between the inverters 31 and 33. The capacitor 34 is connected between the ground terminal and a connection point between the inverters 33 and 35. An output M from the inverter 36 and the output signal C of the comparator circuit 5, which is input through the input terminal 30, are input to the 2-input NOR gate 37. An output terminal of the NOR gate 37 is connected to an input terminal of the inverter 38, and an output N from the inverter 38 is provided to an output terminal 39 of the fall delay circuit 9.

The NOR gate 37 and the inverter 38 constitutes an OR circuit.

(B-2) Operation of Second Embodiment

Figure 10:
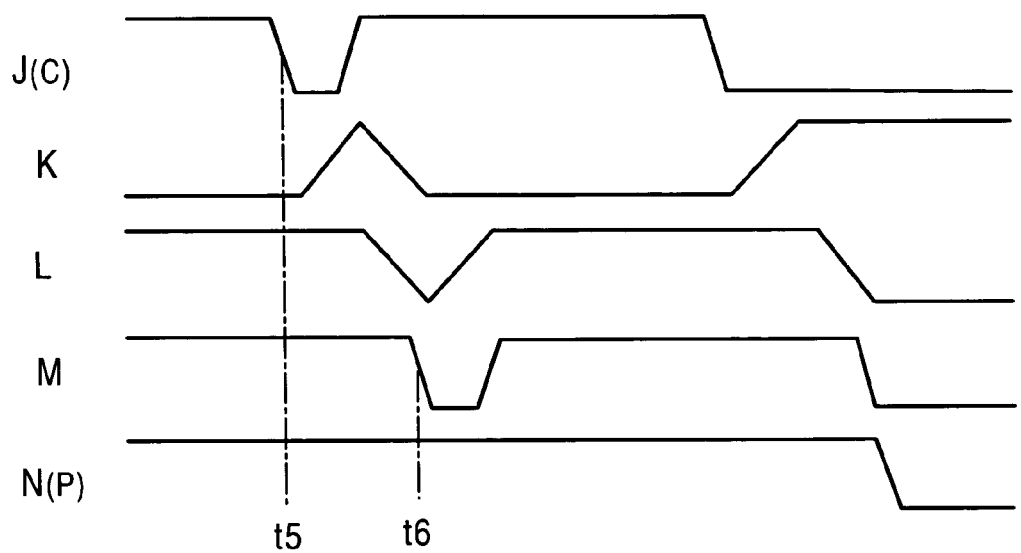
FIG. 10 is a timing chart of each node of the fall delay circuit according to the second embodiment.

The operation of the reset circuit according to the second embodiment will now be described with reference to timing charts of FIGS. 10 and 11.

The voltage division circuit 10, the reference voltage circuit 6, and the comparator circuit 5 in the reset circuit according to the second embodiment operate in the same manner as those of the conventional reset circuit shown in FIG. 2 (see FIGS. 3 and 4).

Figure 11:
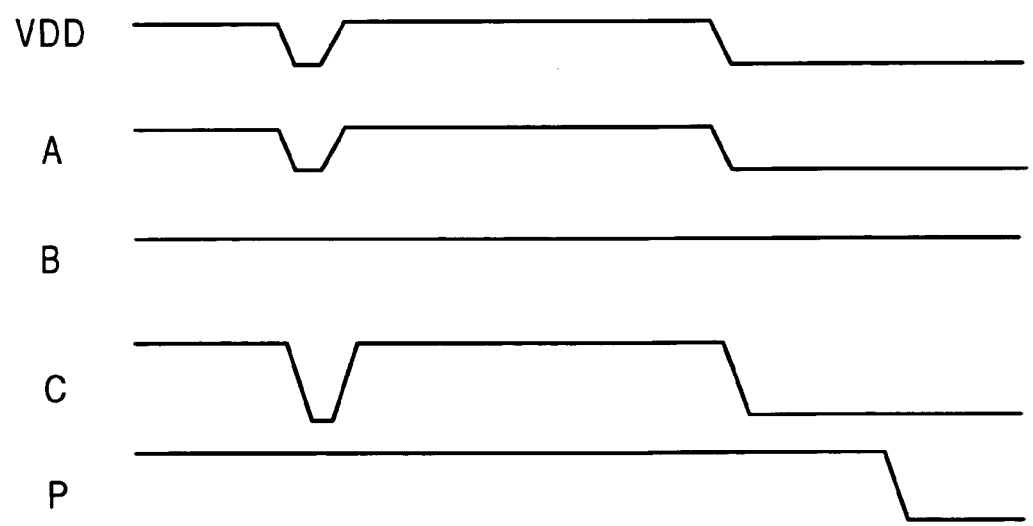
FIG. 11 is a timing chart of each node of the reset circuit according to the second embodiment.

The reset circuit according to the second embodiment is characterized in that the fall delay circuit 9 operates so as to prevent the output P (denoted by "N" in FIG. 9) of the reset circuit from falling to the "L" level even if the output C from the comparator circuit 5 momentarily falls to the "L" level due to noise or the like after the output C of the comparator circuit 5 is stabilized at the "H" level as illustrated in an early part of the timing chart of FIG. 11.

Thus, a description will now be given of how the fall delay circuit 9 operates.

Even when the power supply voltage VDD falls below a predetermined voltage $V_0$ during a very short period of time (for example, 50 ns) and thus the comparator circuit 5 outputs a signal C at the "L" level, such a short-period "L" signal is eliminated in the fall delay circuit 9.

Each of the outputs from the inverters 31, 33, 35, and 36 prior to the NOR gate 37 varies following such a change in the output C of the comparator circuit 5 (i.e., an input J to the fall delay circuit 9) with a specific delay time. As shown in an early part of the timing chart of FIG. 10, the output M from the inverter 36, which varies after a specific delay time (t5 to t6) from the change in the comparator circuit output C (i.e., the input J to the fall delay circuit 9), is input to one of the input terminals of the 2-input NOR gate 37. The comparator circuit output C (i.e., the input J to the fall delay circuit 9) has returned to the "H" level during the period in which the output M is changed to the "L" level. The comparator circuit output C (i.e., the input J to the fall delay circuit 9) is input to the other input terminal of the 2-input NOR gate 37. The NOR gate 37 and the inverter 38 constitute an OR circuit as described above. During the period in which the output M from the inverter 36 is changed to the "L" level, an output N from the OR circuit still remains at the "H" level since the comparator circuit output C (i.e., the input J to the fall delay circuit 9), which has returned to the "H" level, is input to the other input terminal of the 2-input NOR gate 37.

Thus, the fall delay circuit 9 outputs a signal N from which the short-period "L" signal in the comparator circuit output C has been eliminated.

As illustrated in the later parts of the timing charts of FIGS. 10 and 11, when the power supply voltage VDD falls and remains below the predetermined voltage $V_0$ and thus the comparator circuit output C (i.e., the input J to the fall delay circuit 9) is not momentarily changed to the "L" level but remains at the "L" level, the comparator circuit output C does not return to the "H" level, so that both the inputs to the NOR gate 37 are at the "L" level after a certain time from the change in the comparator circuit output C. Accordingly, the output N (denoted by "P" in FIG. 11) from the fall delay circuit 7 falls after a specific delay time from the fall of the power supply voltage VDD.

(B-3) Advantage of Second Embodiment

Even when the power supply voltage momentarily falls below the predetermined voltage $V_0$ due to noise or the like and thus the comparator circuit output C falls to the "L" level, the reset circuit according to the second embodiment outputs no reset signal as described above, thereby preventing the system from operating abnormally due to frequent erroneous resets.

(C) Third Embodiment

A reset circuit according to a third embodiment of the present invention will now be described in detail with reference to the drawings.

(C-1) Configuration of Third Embodiment

Figure 12:
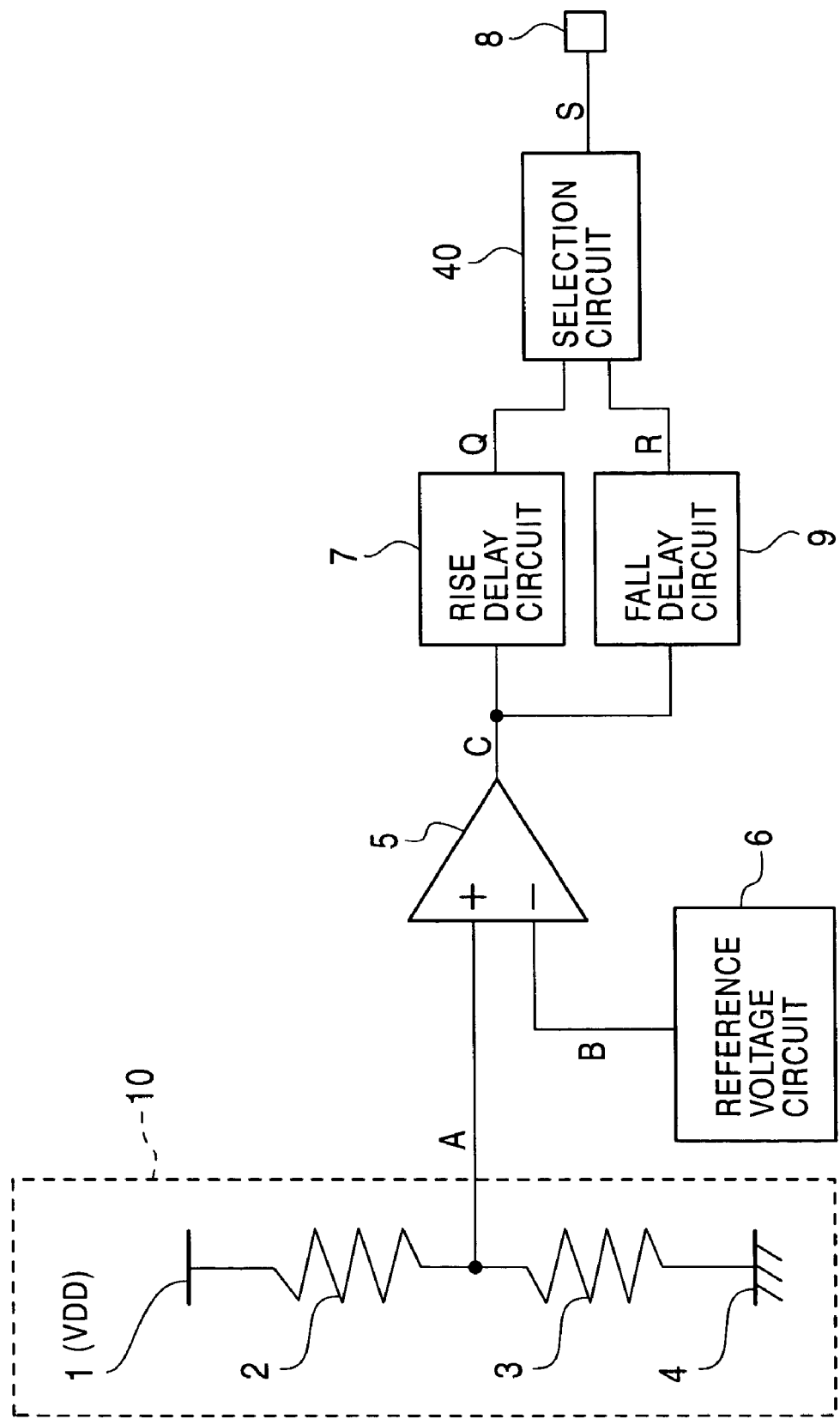
FIG. 12 is a block diagram illustrating a reset circuit according to a third embodiment of the present invention.

FIG. 12 is a block diagram illustrating a reset circuit according to the third embodiment, where elements identical or corresponding to those of the first and second embodiments shown in FIGS. 1 and 8 are denoted by the same reference numerals.

In FIG. 12, the reset circuit according to the third embodiment comprises a reset circuit body including a voltage division circuit 10, a reference voltage circuit 6, and a comparator circuit 5, and further comprises a rise delay circuit 7, a fall delay circuit 9, and a selection circuit 40.

The rise delay circuit 7 is similar to that described in the first embodiment (see FIG. 5), and the fall delay circuit 9 is similar to that described in the second embodiment (see FIG. 9). The selection circuit 40 selects either an output Q from the rise delay circuit 7 or an output R from the fall delay circuit 9, and outputs it as an output signal S of the reset circuit.

As described above, the rise delay circuit 7 is provided to avoid the problem occurring when the supply of the power supply voltage VDD is initiated, and the fall delay circuit 9 is provided to avoid the problem caused by the short interruption occurring after the power supply voltage VDD is stabilized. Activation timings of the rise and fall delay circuits 7 and 9 are different, and no problem occurs even if the selection circuit 40 selects either the output Q from the rise delay circuit 7 or the output R from the fall delay circuit 9.

Figure 13:
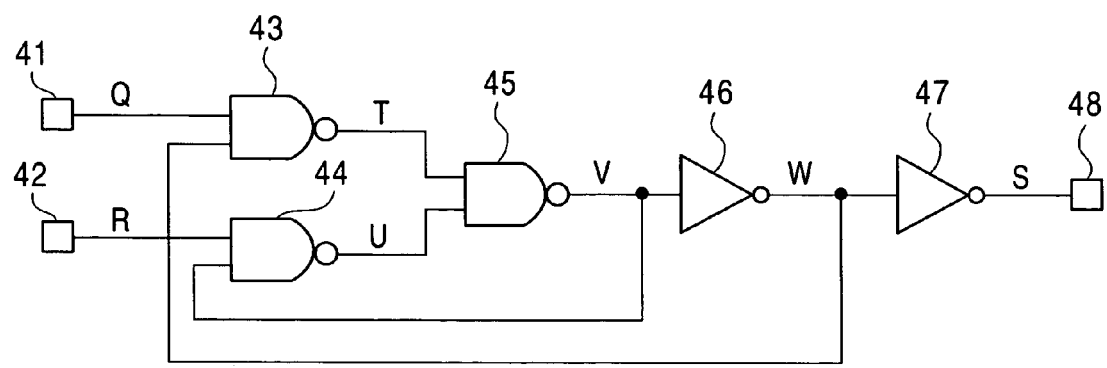
FIG. 13 is a block diagram illustrating a selection circuit according to the third embodiment.

FIG. 13 is a block diagram of a detailed example of the selection circuit 40. In FIG. 13, the selection circuit comprises three 2-input NAND gates 43 to 45 and two inverters 46 and 47.

The NAND gate 43 receives an output Q from the rise delay circuit 7, which is input through a first input terminal 41 of the selection circuit 40, and an output W from the inverter 46. An output T from the NAND gate 43 is input to one input terminal of the NAND gate 45. The NAND gate 42 receives an output R from the fall delay circuit 9, which is input through a second input terminal 42 of the selection circuit 40, and an output V from the inverter 45. An output U from the NAND gate 44 is input to the other input terminal of the NAND gate 45. The output V from the NAND gate 45 is input to the inverter 46, and is also input to the NAND gate 44 as described above. The output W from the inverter 46 is input to the inverter 47, and is also input to the NAND gate 4e as described above. The output from the inverter 47 is output through the output terminal 48 of the selection circuit 40.

(C-2) Operation of Third Embodiment

The operation of the reset circuit according to the third embodiment will now be described with reference to a timing chart of FIG. 14.

Until the rise delay circuit 7 and the fall delay circuit 9 form the outputs Q and R, the voltage division circuit 10, the reference voltage circuit 6, the comparator circuit 5, the rise delay circuit 7, and the fall delay circuit 9 operate in a similar manner as described above in the first or second embodiment. Thus, a description will now be given of how the selection circuit 40 operates.

Figure 14:
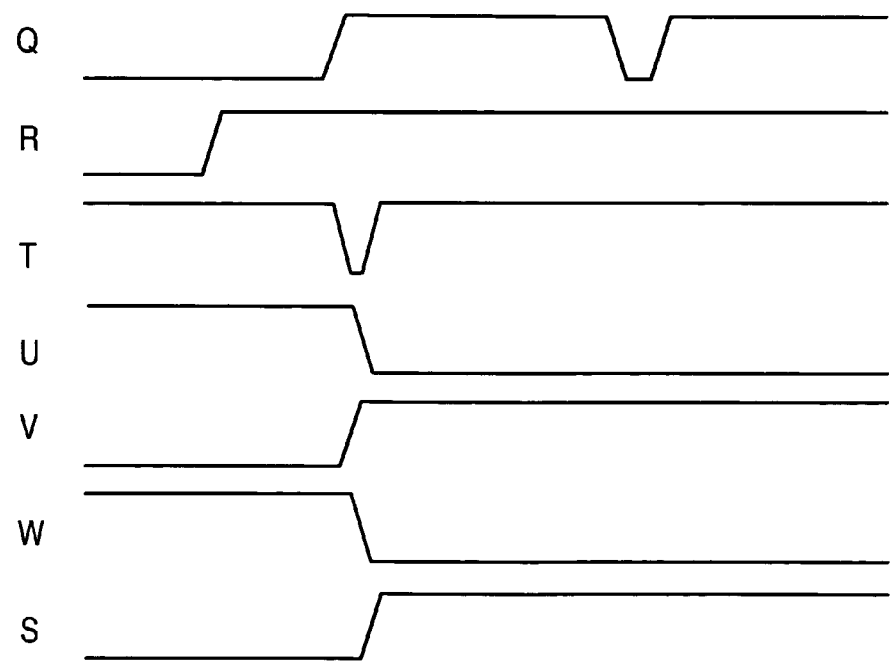
FIG. 14 is a timing chart of each node of the selection circuit according to the third embodiment.

An early part of the timing chart of FIG. 14 shows how the signal of each node of the selection circuit 40 varies when the supply of the power supply voltage VDD is initiated, and a later part thereof shows the signal of each node of the selection circuit 40 when a short interruption occurs during a period in which the power supply voltage VDD is stabilized.

It is desirable that, in the former case, the output Q from the rise delay circuit 7 be selected to avoid the problem caused by a sharp rise of the power supply voltage VDD when the supply of the power supply voltage VDD is initiated, and, in the latter case, the output R from the fall delay circuit 9 be selected to prevent a short interruption from causing a reset in the stabilized period of the power supply voltage VDD as described above.

The output from the rise delay circuit 7 and the output R from the fall delay circuit 9 have the same initial value "L" immediately after the supply of the power supply voltage VDD is initiated. Accordingly, as shown in the early part of the timing chart of FIG. 14, the outputs T and U from the NAND gates 43 and 44 are at the "H" level, so that the output V from the NAND gate 45 is at the "L" level, the output W from the inverter 46 is at the "H" level, and the output S from the inverter 47 is at the "L" level. Since the rise delay circuit 7 delays the rise of its output Q, the output V from the NAND gate 45 is at the "L" level although the output R from the fall delay circuit 9 rises earlier, so that the rise of the output R from the fall delay circuit 9 is disregarded.

Thereafter, when the output Q from the rise delay circuit 7 rises, the output T from the NAND gate 43 falls to the "L" level, the output V from the NAND gate 45 rises to the "H" level, the output W from the inverter 46 falls to the "L" level, and the output S from the inverter 47 rises to the "H" level.

The output W from the inverter 46 is fed back to the NAND gate 43, and the output V from the NAND gate 45 is fed back to the NAND gate 44. The logic level of the output V from the NAND gate 45 is basically opposite to the logic level of the output W from the NAND gate 46. Although the output T from the NAND gate 43 falls to the "L" level due to the rise of the output Q from the rise delay circuit 7, the output T immediately returns to the "H" level since the "L" output W from the inverter 46 is fed back to the NAND gate 43. On the other hand, the output U from the NAND gate 44 falls to the "L" level since the "H" output V from the NAND gate 45 is fed back to the NAND gate 44.

After the output T from the NAND gate 43 rises to the "H" level and the output U from the NAND gate 44 falls to the "L" level, the selection circuit 40 enters a stable state in which the logic level of the output of each element of the selection circuit 40 remains unchanged even if the feedback is employed.

As is apparent from the early part of the timing chart of FIG. 14, when the output Q from the rise delay circuit 7 rises, the output S from the selection circuit 40 rises with a short delay and the output S remains at the "H" level after it rises. Therefore, when the supply of the power supply voltage VDD is initiated, the selection circuit 40 can be regarded as having selected the output Q from the rise delay circuit 7.

As shown in the later part of the timing chart of FIG. 14, when the selection circuit 40 has entered the stable state as described above, the output T from the NAND gate 43 remains unchanged and the selection circuit 40 remains in the stable state even if a momentary "L" signal occurs in the output Q from the rise delay circuit 7, for example, due to a short interruption of the power supply voltage VDD since the input W of the NAND gate 43, other than the input thereof receiving the output Q from the rise delay circuit 7, has already been at the "L" level. When the selection circuit 40 has entered the stable state, the selection circuit 40 can be regarded as having selected the output R from the fall delay circuit 9 because any change in the output Q from the rise delay circuit 7 is disregarded and the logic level of the output S from the selection circuit 40 is also equal to the logic level of the output R from the fall delay circuit 9.

(C-3) Advantage of Third Embodiment

As described above, the reset circuit according to the third embodiment selects, as its output signal, the output from the rise delay circuit 7 when the power supply voltage rises and the output from the fall delay circuit 9 when the reset circuit is in a reset release state, thereby providing a reset circuit which can output a proper reset signal even when the power supply voltage rises sharply and can also prevent output of a reset signal when the power supply voltage momentarily falls below the predetermined voltage $V_0$ due to noise or the like.

(D) Other Embodiments

The rise delay circuit 7 and the fall delay circuit 9 may share some components although they are illustrated as completely separate circuits in the third embodiment. For example, the rise delay circuit 7 and the fall delay circuit 9 may be designed to share the inverters 21, 23, 25, and 26 and the capacitors 22 and 24 shown in FIG. 5, or the inverters 31, 33, 35, and 36 and the capacitors 32 and 34 shown in FIG. 9.

In addition, the rise delay circuit, the fall delay circuit, and/or the selection circuit may have different circuit configurations or schemes from those of the first to third embodiments, provided that they have equivalent functions. Equivalent circuits of the rise delay circuit 7 or the fall delay circuit 9 may be connected in a cascade fashion or the number of inverters or the like therein may be increased to increase the delay time.

The configuration for producing a signal for input to the rise delay circuit or the fall delay circuit is not limited to those of the above embodiments. For example, any configuration of the Japanese patent publication described above in the related art, other than the configuration shown in FIG. 2, may be employed. Further, the rise delay circuit, the fall delay circuit, and/or the selection circuit can be added to a reset circuit which employs no reference voltage circuit. For example, a rise delay circuit, which is also used to delay the fall, may be provided.

Although the "L" level in the output signal of the reset circuit has been described as indicating the reset in the above embodiments, the opposite level may also be employed as a valid logic level indicating the reset. The "H" level may also be employed as a valid logic level indicating the reset in the conventional reset circuit prior to the addition of the rise or fall delay circuit. In this case, the fall delay circuit instead of the rise delay circuit is applied to the first or second embodiment, and the rise delay circuit instead of the fall delay circuit is applied to the first or third embodiment.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No.2004-314279 which is hereby incorporated by reference.

What is claimed is:

1. A reset circuit comprising:
a first circuit for outputting a signal indicating a reset when supply of a power supply voltage is applied until the power supply voltage reaches a sufficient value and indicating release of the reset after the power supply voltage reaches the sufficient value;
a second circuit configured to be operable at a second stage of the first circuit, for outputting a signal obtained by delaying start of the indication of the release of the reset in the outputted signal of the first circuit by a time that the power supply voltage rises when the supply of the power supply voltage is applied;
a momentary reset indication elimination circuit, configured to be operable at a second stage of the first circuit, for eliminating a momentary change indicating the reset in the outputted signal of the first circuit when the momentary change occurs in the output signal after the power supply voltage rises; and
a selection circuit for selecting, as an output from the reset circuit an output signal of the second circuit when the supply of the power supply voltage is initiated and an output signal of the momentary reset indication elimination circuit after the power supply voltage rises.

2. A reset circuit according to claim 1, wherein said momentary reset indication elimination circuit includes:
a delay portion for delaying the output signal of the first circuit to generate a delayed signal; and
an OR gate for performing logical OR operation of the output signal and the delayed signal.

3. A reset circuit according to claim 2, wherein a delay time of said delay portion is longer than the duration of the momentary change.

4. A reset circuit comprising;
a first circuit for outputting a signal indicating a reset when supply of a power supply voltage is applied until the power supply voltage reaches a sufficient value and indicating release of the reset after the power supply voltage reaches the sufficient value;
a second circuit, configured to be operable at a second stage of the first circuit, for outputting a signal obtained by delaying start of the indication of the release of the reset in the outputted signal of the first circuit by a time that the power supply voltage rises when the supply of the power supply voltage is applied;
a momentary reset indication elimination circuit, provided subsequent to the first circuit, for eliminating a momentary change indicating the reset in the output signal of the first circuit when the momentary change occurs in the output signal after the power supply voltage rises; and
a selection circuit for selecting, as an output from the reset circuit, an output signal of the second circuit when the supply of the power supply voltage is initiated and an output signal of the momentary reset indication elimination circuit after the power supply voltage rises.

5. A reset circuit according to claim 4, wherein said second circuit includes a first delay portion for delaying the output signal of the first circuit to generate a first delayed signal, and an AND gate for performing logical AND operation of the output signal and the first delayed signal, and said momentary reset indication elimination circuit includes a second delay portion for delaying the output signal of the first circuit to generate a second delayed signal, and an OR gate for performing logical OR operation of the output signal and the second delayed signal.

6. A reset circuit according to claim 4, wherein a delay time of said second delay portion is longer than the duration of the momentary change.

7. A reset circuit comprising:
a first circuit, wherein the first circuit is configured to output a reset signal during a time period in which a power supply is applied and until an output voltage proportional to a voltage of the power supply reaches a reference voltage, wherein the first circuit is further configured to output a reset release signal after the output voltage exceeds the reference voltage;
a second circuit configured to be operable at a second stage of the first circuit, wherein the second circuit is operable such that the second circuit outputs a reset signal during a predetermined time period after the power supply is applied;
a momentary reset indication elimination circuit provided subsequent to the first circuit, for eliminating a momentary change indicating the reset in the output signal of the first circuit when the momentary change occurs in the output signal after the power supply voltage rises; and
a selection circuit for selecting, as an output from the reset circuit, an output signal of the second circuit when the supply of the power supply voltage is initiated and an output signal of the momentary reset indication elimination circuit after the vower supply voltage rises.

* * * * *